United States Patent [19]
Borel

[11] Patent Number: 6,130,460
[45] Date of Patent: Oct. 10, 2000

[54] INTERCONNECT TRACK CONNECTING, ON SEVERAL METALLIZATION LEVELS, AN INSULATED GATE OF A TRANSISTOR TO A DISCHARGE DIODE WITHIN AN INTEGRATED CIRCUIT, AND PROCESS FOR PRODUCING SUCH A TRACK

[75] Inventor: Joseph Borel, Saint Egreve, France

[73] Assignee: SGS-Thomson Microelectronics S.A., Gentilly, France

[21] Appl. No.: 09/093,302

[22] Filed: Jun. 8, 1998

[30] Foreign Application Priority Data

Jul. 10, 1997 [FR] France ................................. 97 08807

[51] Int. Cl.[7] ............................................. H01L 21/4763
[52] U.S. Cl. ......................... 257/356; 438/618; 438/599; 438/910; 257/355; 257/360; 257/773
[58] Field of Search ..................................... 438/618, 622, 438/647, 599, 910, 129, 130; 257/356, 355, 360, 773, 776

[56] References Cited

U.S. PATENT DOCUMENTS

| | | | |
|---|---|---|---|
| 5,393,701 | 2/1995 | Ko et al. | 438/617 |
| 5,457,336 | 10/1995 | Fang et al. | 257/322 |
| 5,744,838 | 4/1998 | Matsuo et al. | 257/356 |

FOREIGN PATENT DOCUMENTS 0 693 783  1/1996  European Pat. Off. ........ H01L 27/02

OTHER PUBLICATIONS

Uraoka et al., "Evaluation of Plasma Damage to Gate Oxide", IEICE Transaction son Electronics, vol. E77–C, No. 3, (Mar. 1, 1994), pp. 453–457.

*Primary Examiner*—Caridad Everhart
*Attorney, Agent, or Firm*—Theodore E. Galanthay; Allen, Dyer, Doppelt, Milbrath & Gilchrist, P.A.

[57] ABSTRACT

An interconnect track connects, on several metallization levels, an insulated gate of a transistor to a discharge diode within an integrated circuit. The interconnect track comprises a first track element extending under the highest metallization level, having a first end connected to the gate and having a length greater than a predetermined critical length. This first track element includes an interrupted track portion at a site a first distance less than the critical length away from the first end. This point is compatible with the placement of the metallization level above, and extends between two insulating layers on the same metallization level. The two branches of the interrupted portion are mutually connected by a metallic filling contact which also extends in the insulating support layer of the metallization level immediately above that containing the interrupted track portion.

31 Claims, 5 Drawing Sheets

INTERCONNECT TRACK CONNECTING, ON SEVERAL METALLIZATION LEVELS, AN INSULATED GATE OF A TRANSISTOR TO A DISCHARGE DIODE WITHIN AN INTEGRATED CIRCUIT, AND PROCESS FOR PRODUCING SUCH A TRACK

FIELD OF THE INVENTION

The invention relates to the fabrication of semiconductor integrated circuits, and, more particularly, to the production of such an integrated circuit including a metallic interconnect track connecting, on several metallization levels, an insulated gate of a transistor to a discharge diode. The invention also relates to the integrated circuits having such interconnect tracks.

BACKGROUND OF THE INVENTION

In general, the production of interconnect tracks in integrated circuits includes, for each metallization level, the deposition of a metal layer on a thick insulating layer. The insulating layer, for example, may be a layer of silicon dioxide having a thickness of 6000 $\mu$. The deposition is followed by etching, generally plasma etching, of the metal layer to obtain a track having a predefined width and a predefined length.

Those skilled in the art know that, during this etching operation, electric charges are deposited on the metallic segments. Now, in some cases, such a metal segment may be connected to the insulated gate of an insulated-gate field-effect transistor (MOSFET transistor) and have its other end free, i.e. not connected to another component. Such a connection is then called a "floating" connection. If the length of this floating connection is too great, the amount of charge deposited on the corresponding metallic segment, which is proportional to the length of the latter, will create too great of a flow of charge through the gate oxide. The gate oxide is a thin oxide, and the flow of charge may lead to a degradation of the performance characteristics of the transistor quite quickly and quite suddenly.

Special rules for designing such interconnect tracks, known to those skilled in the art by the name "Antenna rules", are therefore defined. These rules include the creation of discharge paths for the electric charges accumulated on the metallic segments. For example, provision may be made for the gate of a MOSFET transistor to be connected to a discharge diode formed, for example, by the source region or by the drain region of another MOS transistor or else by a specific region produced in the semiconductor substrate. Furthermore, in the absence of a protective diode, these rules define a maximum ratio between the area of metal of a floating connection and the area of the gate of the transistor. In practice, given that the widths of the gates and the widths of the tracks are identical, a critical length $L_c$ is defined which a floating connection must not exceed. This critical length $L_c$ is typically about 200 times the length of $L_G$ of the gate.

When an interconnect track connects the gate of an MOS transistor to a discharge diode on only one metallization level, the problem mentioned above does not arise. This is so because during the operation of etching the interconnect track, the connection is not floating, and the electric charges are removed in the discharge diode.

The problem mentioned above arises for an interconnect track connecting the gate of an MOS transistor to a discharge diode on at least two metallization levels, with a track element extending under the highest metallization level and having a length greater than the critical length.

When the general design diagram of the integrated circuit, i.e. the diagram indicating the position of all the components of the integrated circuit and the geometrical configuration of all the interconnect tracks, has been defined, generally by means of a CAD tool, and when such a general design diagram reveals an interconnect track whose geometrical characteristics are in violation of the antenna rules defined above, a conventional approach includes modifying the initial geometrical configuration of such an interconnect track. For example, it may be modified by "praising" it vertically within the integrated circuit so as to reach a higher metallization level allowing direct connection to the discharge diode. Apart from the fact that such an approach requires manual modifications on a case-by-case basis, it also leads to integrated circuits which may be more complicated to produce than those initially provided and may not have the desired maximum compactness.

Another approach may include systematically using components comprising a MOSFET transistor and a discharge diode in the immediate vicinity of this transistor so as not to violate the above-defined antenna rules. However, such an approach would lead to a significant increase in the area of the integrated circuit.

SUMMARY OF THE INVENTION

In view of the foregoing background, an object of the invention is to provide a process for producing an interconnect track whose initial geometrical configuration reveals a violation of the antenna rules, and accounting for this without fundamentally modifying this initial geometrical configuration and without modifying the general design diagram of the integrated circuit, i.e. without modifying the position of the various components and/or the geometrical configuration of the interconnects of the integrated circuit.

Another object of the invention is to make only a local correction to the initial geometrical configuration of such an interconnect track, which local correction may be automatically defined by means of a CAD tool.

Yet another object of the invention is also to allow to a large extent the use of standard MOSFET transistors already existing in conventional component libraries and not equipped with adjacent protective (discharge) diodes, thereby making it possible to obtain integrated circuits which are denser and more compact, with an increase in the speed performance and a decrease in the power consumed.

The invention therefore provides a process for producing, within an integrated circuit, a metallic interconnect track connecting, on several metallization levels, an insulated gate of a transistor to a discharge diode. In this process an initial geometrical configuration of the track is defined and each metallization level is produced on the basis of forming an insulating support layer and of etching a metal layer deposited on this insulating support layer.

According to a general characteristic of the invention, when the track thus configured includes a first track element extending under the highest metallization level and having a first end connected to the gate and having a length greater than a predetermined critical length, a point is selected, advantageously by a CAD tool, from within the first track element, that is at a first distance less than the critical length away from the first end. In the step of producing the metallization level containing this selected point, a region devoid of metal is etched in the metal layer at the site of this selected point so as to produce an interrupted track portion. Then, in the step of producing the metallization level immediately above, a cavity emerging opposite the region is made in the insulating support layer deposited on the interrupted track portion and the cavity and the region are filled with a filling metal so as to re-establish a metallic contact between the two branches of the interrupted track portion to produce a track element in accordance with its initial geometrical configuration. This is achieved without, a priori, a placement constraint.

In other words, according to the invention, the general design diagram of the integrated circuit is defined without any constraint relating to the antenna rules and then, when an interconnect track is likely to violate the rules, this track is cut at a distance of less than the critical length. Accordingly, when etching the track, the length of metal actually etched, in contact with the plasma and with the gate of the transistor, is less than this critical length. Then, when producing the metallization level immediately above, the two branches of the track which are thus interrupted are short-circuited by filling a via, made in the insulating support layer of the metallization level above, with a conventional filling metal, for example tungsten.

Of course, the track is cut at a site compatible with the general design diagram of the integrated circuit. In other words, the track is cut at a site where it is possible to produce a via in the insulating layer vertically in line with the cut, and to fill this via with a filling metal without the latter coming into contact with other tracks lying on the metallization level above.

Advantageously, a cavity having a larger size than the region of the interrupted track portion is made in the insulating support layer of the metallization level above. Thus, in practice, for a 0.5 micron channel, a cavity having a length of about 1.2 microns will be made for a space of about 0.8 microns between the two branches of the interrupted track portion. The filling metal will then partially cover the branches of the interrupted track portions, which will be conducive to good electrical connection between these two branches.

According to one way of implementing the process according to the invention, in the step of filling the cavity, filling metal is deposited on the insulating support layer lying on the interrupted track portion, as well as in the cavity and in the track interruption region. Then the layer of filling metal deposited on the insulating support layer is chemomechanically polished (CMP). In other words, the via made in the insulating layer and the track interruption region are filled and then a CMP operation is carried out so as to remove the surplus filling metal deposited on the upper surface of the insulating layer. Furthermore, the CMP operation has the advantage of not inducing additional electric charges at the gate of the transistor.

Of course, these various steps may be repeated, where appropriate, at each metallization level if the corresponding track elements are floating connections and have lengths greater than the critical length.

Thus, according to one way of implementing the process according to the invention, when the first track element includes several parts extending over several separate metallization levels lying under the highest metallization level, a first metallic filling contact may be produced on a first part. This first contact is at the first distance away from the gate, and then a second metallic filling contact, similar to the first, may be produced on at least one second part. This second contact is at a second distance away from the end of this second part connected to the first part. Each of the first and second distances may be less than the critical length.

The subject of the invention is also an integrated circuit having such a metallic interconnect track, and, more particularly, a metallic interconnect track connecting, on several metallization levels, within an integrated circuit, an insulated gate of a transistor to a discharge diode.

According to a general characteristic of the invention, this metallic interconnect track comprises a first track element extending under the highest metallization level, having a first end connected to the gate and having a length greater than a pre-determined critical length. This first track element includes an interrupted track portion at a site a first distance less than the said critical length away from the first end, and extends between two insulating layers on the same metallization level. The two branches of the interrupted portion are mutually connected by a metallic filling contact also extending in the insulating support layer of the metallization level immediately above the one containing the interrupted track portion.

According to one embodiment of the invention, that part of the metallic contact which lies between the ends of the two branches of the interrupted track portion has a smaller area than that of the upper part of the metallic contact which extends in the upper insulating layer. This upper part partially bears on the two branches of the interrupted track portion.

The electrical resistance of the metallic contact is about that of a conventional via. In other words, it is low, typically about a fraction of an ohm, typically 0.5 ohms.

During the operation of etching the cavity in the upper insulating layer, a slight etching in the lower insulating layer beneath the region devoid of metal also occurs. Thus, the metallic contact includes a lower part extending with a convex profile in the lower insulating layer. Such a profile will also be conducive to obtaining good electrical contact between the two branches of the interrupted track portion.

This being the case, if it is desired for the metallic filling contact not to project into the lower insulating layer provision is made to deposit, on the lower insulating layer, a layer of another insulator which will not be etched when etching the cavity. In practice, if the insulating layers are made of silicon dioxide ($SiO_2$), silicon nitride ($Si_3N_4$) may be used for this other insulating material.

BRIEF DESCRIPTION OF THE DRAWINGS

Other advantages and features of the invention will appear on reading the detailed description of entirely non-limiting embodiments and methods of implementation, and on examining the appended drawings in which.

DETAILED DESCRIPTION OF THE PREFERRED EMBODIMENTS

In FIGS. 1 to 5, the reference SB denotes a semiconductor substrate, for example a silicon substrate, within which has been produced a well CS intended to house the active regions of an insulated-gate field-effect transistor, only the drain D and source S regions of which have been shown diagrammatically, for the sake of simplification. The gate of this transistor (a MOSFET transistor), buried in the well CS, is insulated from the substrate by a thin oxide layer OX.

A region DD forming a discharge diode is also made in this substrate. This region DD may, for example, be the source or drain region of another field-effect transistor.

Figure 1:
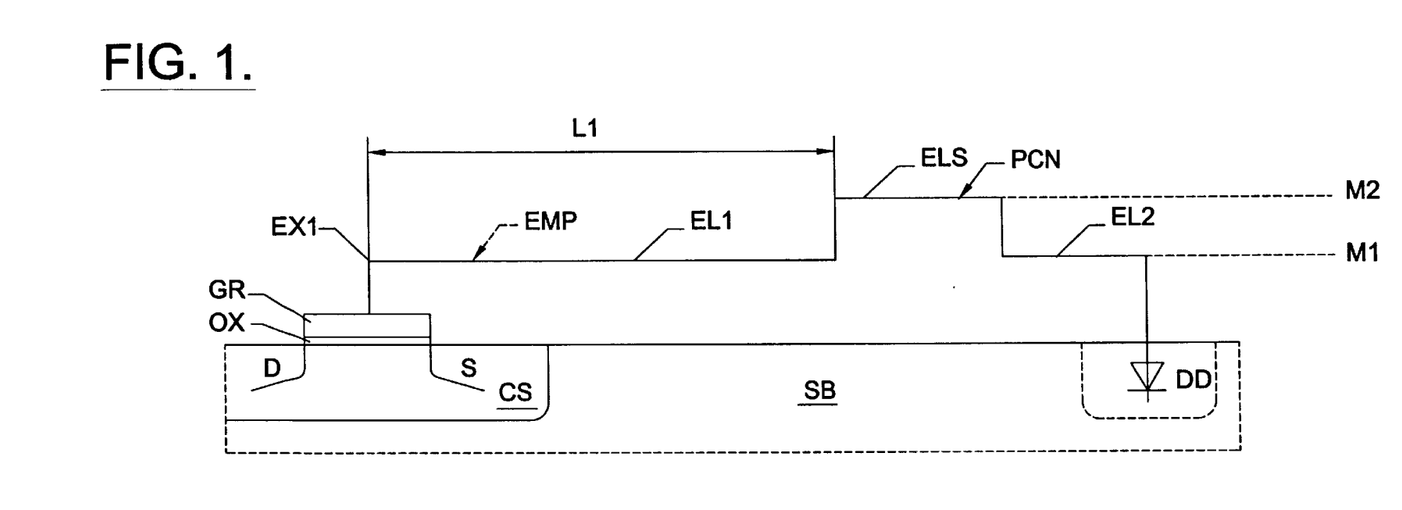
FIG. 1 shows diagrammatically the initial geometrical configuration of an interconnect track connecting the gate of an MOS transistor to a discharge diode.

The general design diagram of the integrated circuit, i.e. the diagram indicating the overall placement of all the components and all the interconnect tracks of the integrated circuit within which this transistor and the discharge diode DD lie, provides for the gate GR of the transistor and the region DD to be interconnected by an interconnect track PCN extending over two metallization layers M1 and M2. It is assumed in fact, as illustrated in FIG. 1, that it was not possible to connect the gate of the transistor to the discharge diode DD by means of an interconnect track extending only over one metallization level because, for example, of the presence of another interconnect track extending transversely to the track PCN. For the sake of simplification, this other track has not been shown in FIGS. 1 to 5.

The track PCN has a first track element EL1 and a second track element EL2 extending along the first metallization level M1. A first end EX1 of the track element EL1 is connected by means of an interconnect hole, or "via", to the gate GR of the transistor, while the second end of the track element EL2 is connected by means of a via to the diode region DD.

The second end of the track element EL1 and the first end of the track element EL2 are respectively connected by two vias to a track element ELS of the metallization level M2 above, which in this case is the highest metallization level.

If the track PCN were to extend only over a single metallization level, there would be no risk of degradation of the gate oxide since, during the operation of etching the metal track, the electric charges would be removed in the discharge diode.

However, in this case, the length L1 of the first track element EL1 is greater than the critical length. By way of indication, for gate lengths of 0.5 microns, the critical length LC not to be exceeded for a floating connection is about 100 microns.

The invention provides a process for satisfying the requirements of the antenna rules and so as not to modify the initial geometrical configuration of the PCN track, and, more generally, the initial configuration of the design or overall placement diagram of the integrated circuit. An example of implementation of which process will now be described in greater detail, more particularly with reference to FIGS. 2 to 6.

Figure 2:
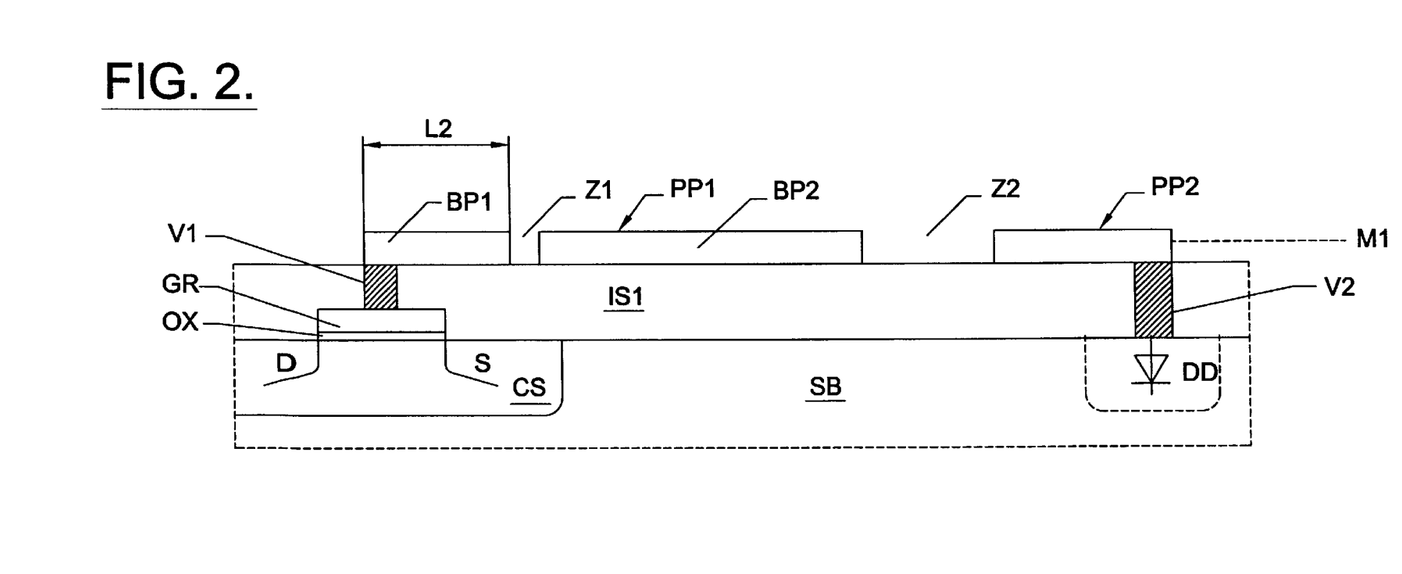
FIGS. 2 to 5 illustrate diagrammatically the main steps in a method of implementing the process of the invention, allowing the physical embodiment of the interconnect track of FIG. 1.
Figure 3:
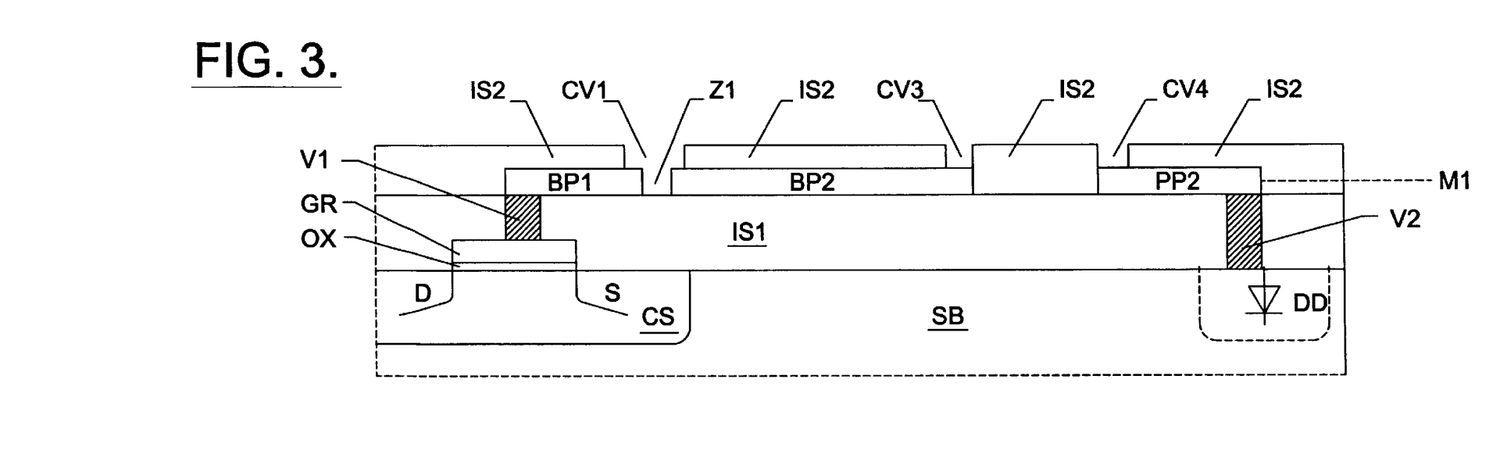

The actual etching of the track portions PP1 and PP2 corresponding respectively to the track elements EL1 and EL2 will now be described with reference to FIG. 2. In this regard, a layer of metal, for example aluminum, is deposited on a lower insulating support layer IS1 in which vias V1 and V2 have been produced beforehand, these being filled with a filling metal, for example tungsten, and allowing the gate of the transistor to be connected to the diode DD region. For the sake of simplification, the steps of producing the layer IS1 and its vias will not be described here, these being well known to those skilled in the art. Likewise, the conventional production of the diffusion barrier layers, for example made of TiN arranged between aluminum metallization levels and tungsten vias will not be described below, for the sake of simplification.

With regard to the definition of the general design diagram of the integrated circuit, and, more particularly, of the initial geometrical configuration of the track PCN, a point EMP located is selected at a site compatible with the general design diagram of the integrated circuit (more particularly, the layer M2). The point EMP furthermore lies at a distance L2 from the gate GR, less than the critical length, and preferably is as close as possible to the gate of the transistor. The point EMP is selected from within the first track element EL1, for example, directly by the CAD tool which has enabled the general integrated-circuit design diagram to be established. We will return later in more detail to this notion of compatibility with the general design diagram of the integrated circuit.

Using a suitable etching mask, the metal layer deposited on the insulating layer IS1 is etched widthwise and lengthwise so as to reveal the track portion PP1 and the track portion PP2. In this regard, the track portion PP1, after the etching, is interrupted at the selected point, and is, therefore, split into two branches BP1 and BP2, which are separated by a region Z1 devoid of metal. Likewise, the track portion PP1 and the track portion PP2 are separated by a region Z2 devoid of metal. Thus, given the fact that the length L2 of the floating connection actually connected to the gate GR is less than the critical length, the antenna rules have been satisfied.

In the next step (FIG. 3), after having conventionally deposited an upper insulating layer IS2 on the metallization level M1, a cavity CV1 is made in this insulating layer IS. This cavity CV1 lies vertically above the region Z1 and emerges into the latter. Likewise, cavities CV3 and CV4 are made, these being intended to form vias for connection to the metallization level above.

Figure 4:
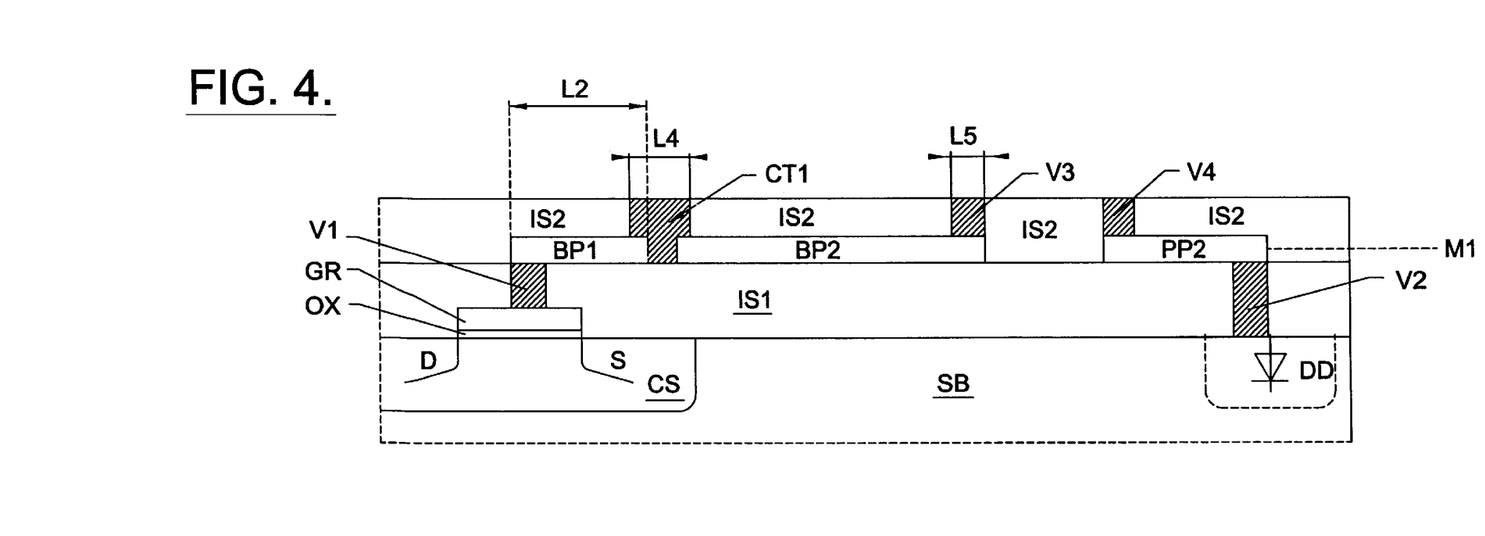

Next, a layer of a filling metal (tungsten, for example) is deposited on the assembly thus formed, which metal fills the cavity CV1, the region Z1 and the cavities CV3 and CV4. This metal layer is then chemo-mechanically polished so that the filling metal lying in the various cavities is flush with the level of the insulating layer IS2 and so that any filling metal between these various cavities is removed (FIG. 4).

Those skilled in the art will therefore note that this operation has at the same time produced the vias V3 and V4 for connection to the metallization levels M2 above, and that furthermore it has produced a metallic filling contact CT1 allowing the electrical contact between the two branches BP1 and BP2 of the interrupted track portion PP1 to be re-established. Thus, the invention is noteworthy in the sense that, by virtue of a local CAD-defined correction to the track element EL1, a corresponding track portion PP1 in accordance with the initial geometrical configuration of the track element EL1 is finally obtained, without any area constraint, and while also satisfying the antenna rules.

During this CMP step, the connection lengths L4 and L5 of the metallic filling contact CT1 and of the via V3 in fact form part of the floating connection which is connected to the gate GR. Moreover, in theory, and in particular, if the step of producing the filling contact and the vias was likely to generate electric charges, it would be necessary for the sum of the lengths L2, L4 and L5 to be less than the critical length. This being so, in practice, essentially only the value of the length L2 will be of interest since the lengths L4 and L5 are extremely small compared to the critical lengths usually defined, for example about 1 micron. Furthermore, the CMP introduces virtually no additional electric charge.

During the next step (FIG. 5), another metal layer is deposited on the upper insulating support layer IS2 and then the track portion PPS of the highest level, corresponding to the metallization level M2, is etched. During this etching operation, the electric charge problems mentioned above do not arise since the gate GR of the transistor is then connected to the discharge diode DD.

Figure 5:
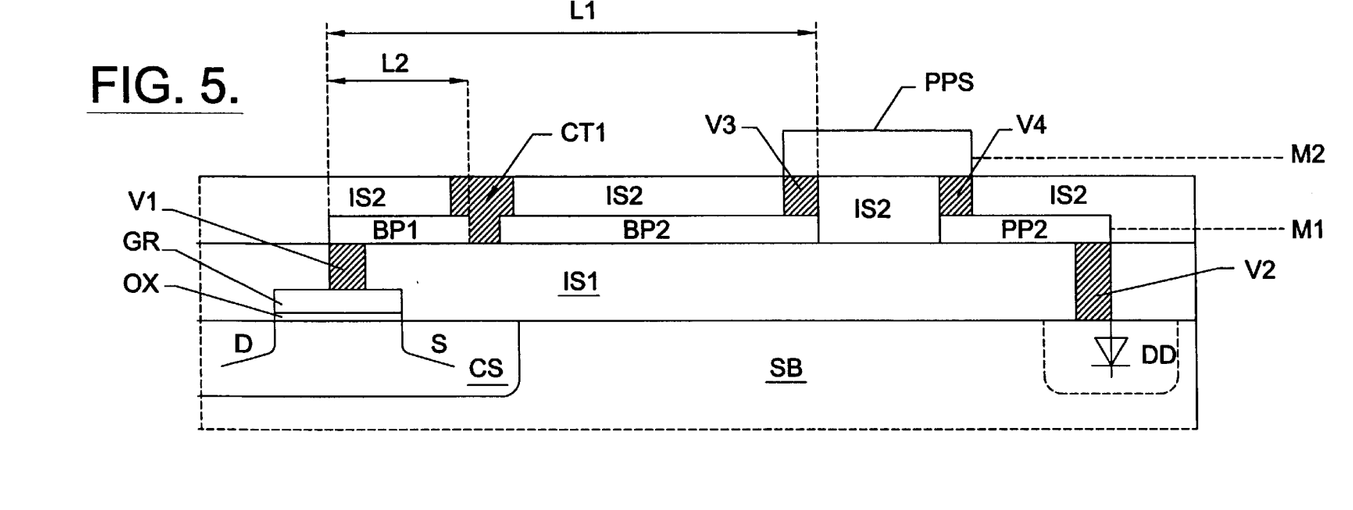

It should be pointed out that the compatibility of the point selected for cutting the track element in this case requires, in particular, that the upper surface of the filling contact CT1 does not come into contact with another interconnect track. Accordingly, the creation of interconnects which are not in accordance with the general circuit diagram of the integrated circuit are avoided. A cutting point, vertically in line with which the insulating support region of the metallization layer immediately above does not support a metal track and which satisfies the rules mentioned above, will in practice therefore be selected.

Figure 6:
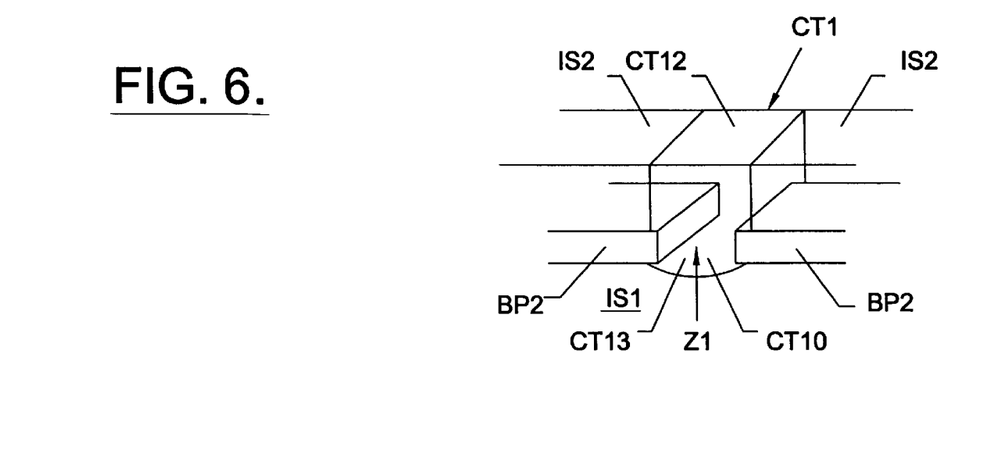
FIG. 6 illustrates in greater detail the shape of a metallic filling contact in the region of the interruption of a track.

FIG. 6 shows that the metallic filling contact CT has an upper part CT12 which extends into the insulating layer IS2 above and which rests partly on the ends of the two branches BP1 and BP2 of the interrupted track portion PP1. This favors good electrical contact between these two branches. Moreover, during the operation of etching the cavity CV1 in the insulating layer IS2, a depression is produced in the lower insulating layer IS1, which is made of the same material (for example, silicon dioxide) as the layer IS2. Consequently, the metallic contact CT1 includes, under the part CT10 lying between the two branches BP1 and BP2, a convex lower part CT13 which also partly encroaches on the ends of the two branches BP1 and BP2, here again favoring good electrical contact.

This being the case, if it is desired not to obtain such a convex lower part a layer of silicon nitride $Si_3N_4$ may optionally be deposited on the insulating layer IS1 of silicon dioxide. The silicon nitride is not etched during the operation of etching the upper insulating layer IS2 formed of silicon dioxide.

Figure 7:
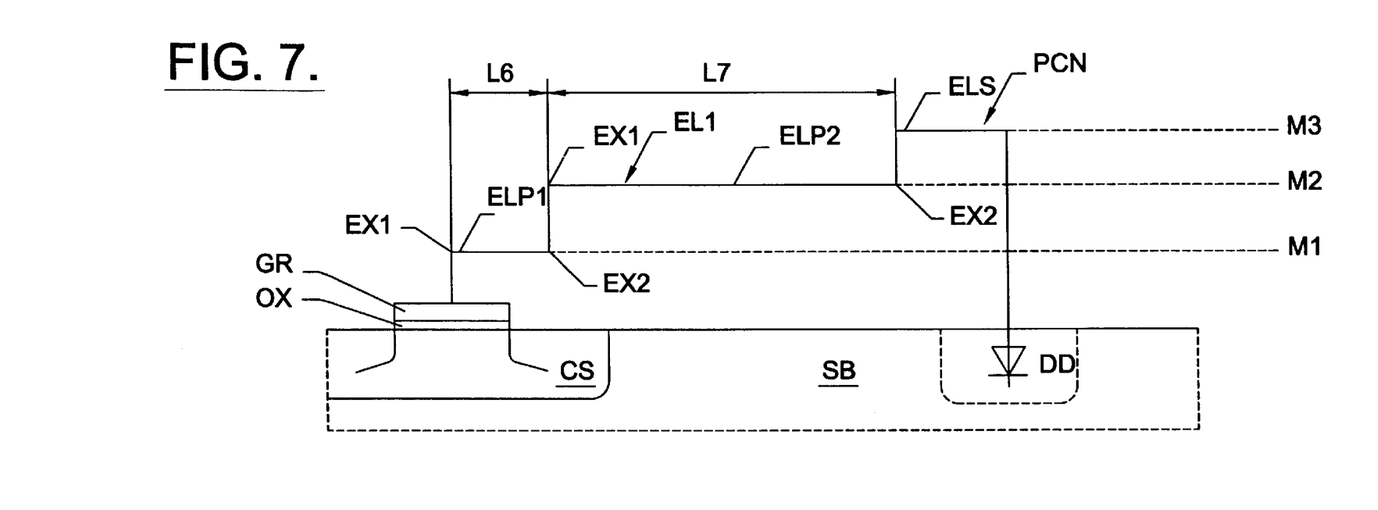
FIGS. 7 and 8 on the one hand, and 9 and 10 on the other hand, diagrammatically illustrate, respectively, two other interconnect tracks according to the invention and their physical embodiment.

It is assumed in FIG. 7 that the initial geometrical configuration of the interconnect track PCN provides three metallization levels M1, M2 and M3, with a first track element EL1 having a first part ELP1 extending along the level M1, and a second part ELP2 extending along the level M2. It is also assumed that the length L7 of the second part ELP2 is itself greater than the critical length, the length L6 of the first part ELP1 being less than the critical length.

Figure 8:
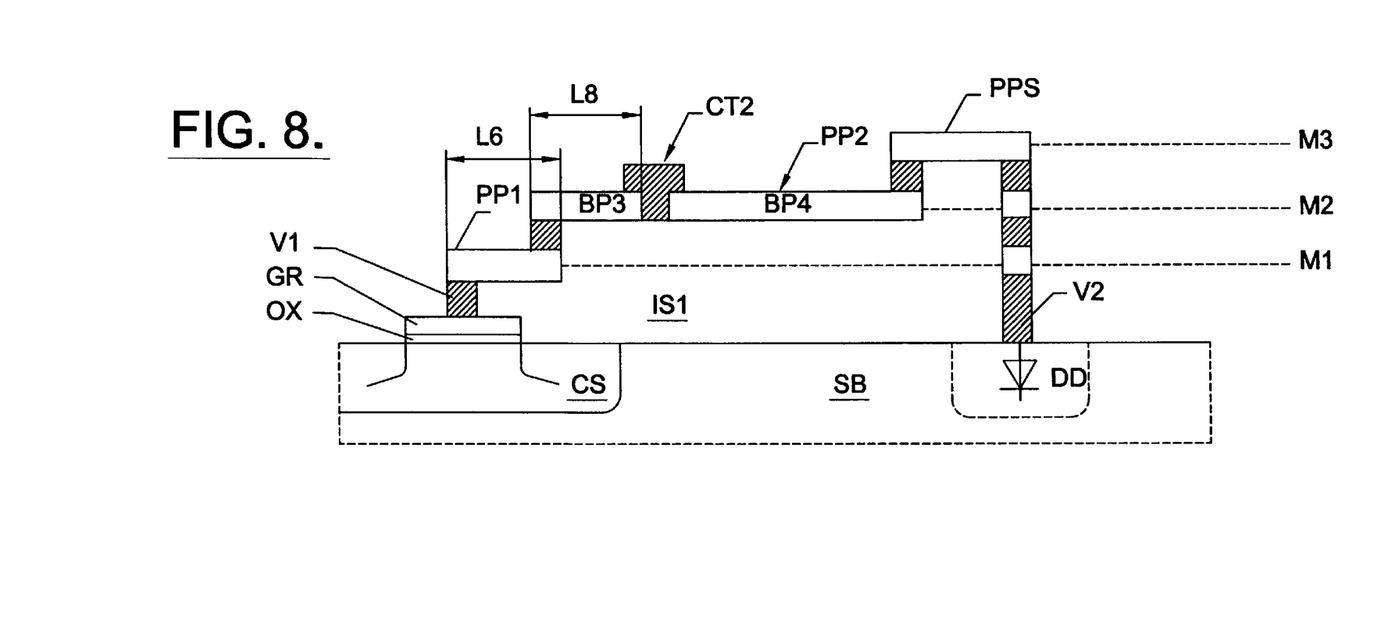

In such a case, a point compatible with the general design diagram of the integrated circuit will be selected, for example from the second part ELP2 of the track element EL1, this point lying at a distance L8 from the first end of this track element ELP2. Accordingly, the length L8 is less than the critical length. In a similar way to what has just been described above with reference to FIGS. 1 to 6, an interrupted track portion PP2 will be produced at this selected point. Then the two branches thus obtained, BP3 and BP4, will be short-circuited by a metallic filling contact CT2 (FIG. 8).

Figure 9:
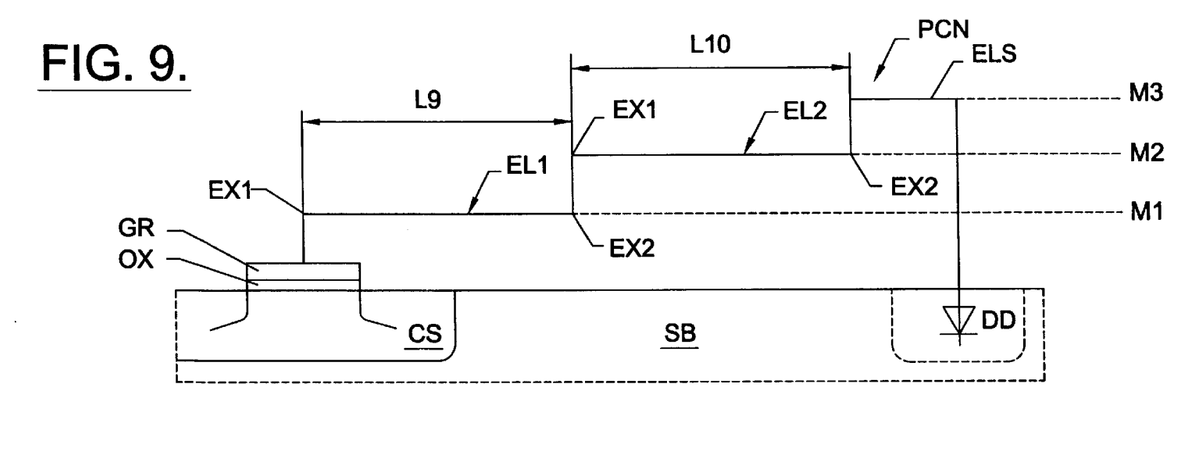
Figure 10:
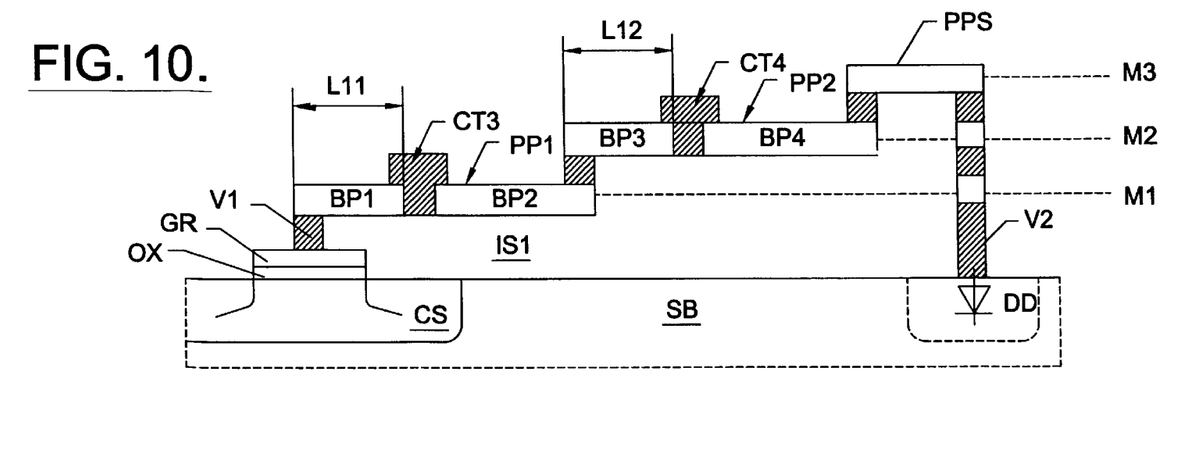

It is assumed in FIG. 9 that the interconnect track PCN again extends over three metallization levels with a first track element EL1 lying at the first metallization level M1 and having a length L9 greater than the critical length, and a second track element EL2 lying at the metallization level M2 and having a length L10 also greater than the critical length. In this case, two points will be selected on these two track elements, these points being respectively spaced away from the first end of the track element corresponding to a distance L11 and L12 (FIG. 10) such that each of the lengths L11 and L12 is less than the critical length. Two metallic contacts CT3 and CT4 will then be produced at these points.

In other words, more generally, when a first track element (for example EL1, FIG. 7) has several parts (ELP1, ELP2) extending over several separate metallization levels lying below the highest metallization level and when the first of these parts (ELP1) has a first end (EX1) directly connected to the gate and a second end (EX2) opposite the first (EX1), each following part (ELP2) having a first end (EX1) connected to the second end (EX2) of a part (ELP1) lying at a metallization level below, and when at least some of these parts (for example ELP2) include, respectively, metallic filling contacts (CT2) respectively an elementary distance (L8) away from the first corresponding end (EX1), each of these elementary distances (L8), as well as the length of each part (for example ELP1) devoid of a metallic filling contact, is less than the critical length.

That which is claimed is:

1. A process for producing, within an integrated circuit, a metallic interconnect track connecting, on a plurality of metallization levels, an insulated gate of a transistor to a discharge diode, the process comprising the steps of:

defining an initial geometrical configuration of the interconnect track to have a first track element extending under a highest metallization level, the first track element having a first end connected to the insulated gate of the transistor and having a length greater than a critical length;

selecting a point along the first track element that is at a first distance less than the critical length away from the first end;

producing each metallization level for the integrated circuit by forming a respective insulating support layer and etching a respective metal layer deposited on the insulating support layer, the step of producing further comprising the steps of forming at the selected point a region devoid of metal etched into the metal layer so as to produce an interrupted track portion including two branches;

forming a cavity emerging opposite the region made in the insulating support layer on the interrupted track portion; and filling the cavity and the region devoid of metal with a filling metal so as to re-establish a metallic contact between the two branches of the interrupted track portion to produce the first track element in accordance with the initial geometrical configuration.

2. A process according to claim 1, wherein the step of forming the cavity comprises forming said cavity to have a larger size than the region devoid of metal.

3. A process according to claim 1, wherein the filling step comprises the steps of:

depositing filling metal on the insulating support layer on the interrupted track portion, as well as in the cavity and in the region devoid of metal; and polishing the deposited filling material.

4. A process according to claim 3, wherein the step of polishing comprises chemo-mechanical polishing.

5. A process according to claim 1, wherein the first track element includes a plurality of parts extending over several separate metallization levels lying under the highest metallization level, and wherein the step of producing further comprises:

forming a first metallic filling contact on a first part and at the first distance away from the gate; and forming a second metallic filling contact on at least one second part and at a second distance away from the end of the second part connected to the first part, and wherein each of the first and second distances is less than the critical length.

6. A process according to claim 1, wherein the steps of defining and selecting comprise performing same using a CAD tool.

7. A process according to claim 1, further comprising the step of forming a convex lower cavity portion below the selected point; and wherein the step of filling the cavity further comprises filling the convex lower cavity portion.

8. A process for producing, within an integrated circuit, a metallic interconnect track connecting, on a plurality of metallization levels, an insulated gate of a transistor to a discharge diode, the process comprising the steps of:

defining an initial geometrical configuration of the interconnect track to have a first track element extending under a highest metallization level, the first track element having a first end connected to the insulated gate of the transistor and having a length greater than a critical length;

selecting a point along the first track element that is at a first distance less than the critical length away from the first end;

producing each metallization level for the integrated circuit by forming a respective insulating support layer and etching a respective metal layer deposited on the insulating support layer, the step of producing further comprising the steps of forming at the selected point a region devoid of metal etched into the metal layer so as to produce an interrupted track portion including two branches;

forming a cavity emerging opposite the region devoid of metal made in the insulating support layer on the interrupted track portion; and filling the cavity and the region devoid of metal with a filling metal by depositing filling metal on the insulating support layer on the interrupted track portion, as well as in the cavity and in the region devoid of metal and polishing the deposited filling material so as to re-establish a metallic contact between the two branches of the interrupted track portion to produce the first track element in accordance with the initial geometrical configuration.

9. A process according to claim 8, wherein the step of forming the cavity comprises forming said cavity to have a larger size than the region devoid of metal.

10. A process according to claim 8, wherein the step of polishing comprises chemo-mechanical polishing.

11. A process according to claim 8, wherein the first track element includes a plurality of parts extending over several separate metallization levels lying under the highest metallization level, and wherein the step of producing further comprises:

forming a first metallic filling contact on a first part and at the first distance away from the gate; and forming a second metallic filling contact on at least one second part and at a second distance away from the end of the second part connected to the first part, and wherein each of the first and second distances is less than the critical length.

12. A process according to claim 8, wherein the steps of defining and selecting comprise performing same using a CAD tool.

13. A process according to claim 8, further comprising the step of forming a convex lower cavity portion below the selected point; and wherein the step of filling the cavity further comprises filling the convex lower cavity portion.

14. A metallic interconnect track connecting, on several metallization levels, within an integrated circuit, an insulated gate of a transistor to a discharge diode, the metallic interconnect track comprising:

a first track element extending under a highest metallization level, and having a first end connected to the gate and having a length greater than a critical length, said first track element including an interrupted track portion at a selected site a first distance less than the critical length away from the first end, said first track element extending between two insulating layers on a same metallization level; and a metallic filling contact in the interrupted track portion for mutually connecting two branches thereof, said metallic filling contact also extending in the insulating support layer of the metallization level immediately above the metallization layer of said interrupted track portion.

15. A metallic interconnect track according to claim 14, wherein a part of the metallic filling contact lying between ends of the two branches of the interrupted track portion has a smaller volume than that of the upper part of the metallic filling contact which extends in the upper insulating layer; and wherein the upper part of the metallic filling contact partially bears on the two branches of the interrupted track portion.

16. A metallic interconnect track according to claim 14, wherein said metallic filling contact has an electrical resistance of about a fraction of an ohm.

17. A metallic interconnect track according to claim 14, wherein the metallic filling contact includes a lower part extending with a convex profile in the lower insulating layer.

18. A metallic interconnect track according to claim 14, wherein the metallic filling contact does not project into the lower insulating layer.

19. A metallic interconnect track according to claim 14, wherein said first track element comprises several parts extending over several distinct metallization levels lying under a highest metallization level.

20. A metallic interconnect track according to claim 19, wherein a first part of said first track element has a first end directly connected to the gate and a second end opposite the first end.

21. A metallic interconnect track according to claim 20, wherein each of the several parts that follows said first part has a respective first end connected to the second end of one of the several parts lying at a respective lower metallization level.

22. A metallic interconnect track according to claim 21, wherein at least some of the parts comprise respective metallic filling contacts respectively an elementary distance away from the corresponding first end; and wherein each of these elementary distances, as well as the length of each part devoid of a metallic filling contact, is less than the critical length.

23. An integrated circuit comprising:

a transistor having an insulated gate;

a discharge diode; and metallic interconnect track connecting, on several metallization levels the insulated gate of the transistor to the discharge diode, the metallic interconnect track comprising a first track element extending under a highest metallization level, having a first end connected to the gate and having a length greater than a critical length, said first track element including an interrupted track portion at a selected site a first distance less than the critical length away from the first end, said first track element extending between two insulating layers on a same metallization level, and a metallic filling contact in the interrupted track portion for mutually connecting two branches thereof, said metallic filling contact also extending in the insulating support layer of the metallization level immediately above the metallization layer of said interrupted track portion.

24. An integrated circuit according to claim 23, wherein a part of the metallic filling contact lying between ends of the two branches of the interrupted track portion has a smaller volume than that of the upper part of the metallic filling contact which extends in the upper insulating layer; and wherein the upper part of the metallic filling contact partially bears on the two branches of the interrupted track portion.

25. An integrated circuit according to claim 23, wherein said metallic filling contact has an electrical resistance of about a fraction of an ohm.

26. An integrated circuit according to claim 23, wherein the metallic filling contact includes a lower part extending with a convex profile in the lower insulating layer.

27. An integrated circuit according to claim 23, wherein the metallic filling contact does not project into the lower insulating layer.

28. An integrated circuit according to claim 23, wherein said first track element comprises several parts extending over several distinct metallization levels lying under a highest metallization level.

29. An integrated circuit according to claim 28, wherein a first part of said first track element has a first end directly connected to the gate and a second end opposite the first end.

30. An integrated circuit according to claim 29, wherein each of the several parts which follows said first part has a respective first end connected to the second end of one of the several parts lying at a respective lower metallization level.

31. An integrated circuit according to claim 30, wherein at least some of the parts comprise respective metallic filling contacts respectively an elementary distance away from the corresponding first end; and wherein each of these elementary distances, as well as the length of each part devoid of a metallic filling contact, is less than the critical length.

* * * * *